US006992507B1

(12) United States Patent
Jackman

(10) Patent No.: US 6,992,507 B1
(45) Date of Patent: Jan. 31, 2006

(54) METHOD FOR SELECTING OPTIMAL I/O BUFFER

(75) Inventor: Tomer Jackman, Marlborough, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 10/812,458

(22) Filed: Mar. 30, 2004

(51) Int. Cl.
*H03K 19/175* (2006.01)
(52) U.S. Cl. ............................ 326/86; 326/21; 326/29; 327/108
(58) Field of Classification Search .................. 326/21, 326/26, 27, 29, 30, 86, 90; 327/108
See application file for complete search history.

(56) References Cited

U.S. PATENT DOCUMENTS 6,414,525 B2 * 7/2002 Urakawa .................... 327/112
6,486,696 B1 * 11/2002 Cao ............................ 326/30
2003/0204765 A1 * 10/2003 Hall ........................... 713/401
2004/0170066 A1 * 9/2004 Gallo et al. ............ 365/189.05

OTHER PUBLICATIONS

"RapidIO Interconnect Specification:" Rev. 1.2/2002 Appendix A pp. IV-109 through IV-115.

* cited by examiner

*Primary Examiner*—Vibol Tan

(57) ABSTRACT

A method for selecting an I/O buffer. The method includes providing a plurality of I/O buffers. Each one of the plurality of I/O buffers has a different performance characteristic. Each one of the plurality of I/O buffers is coupled to a receiving device through a corresponding one of a plurality of transmission lines. Each one of the plurality of buffers is driven by a logic signal. Each one of the transmission lines produces a corresponding series of output logic signals. The plurality of output signals is observed. The method includes selecting one of the plurality of I/O buffers in accordance with the observed output signals.

3 Claims, 5 Drawing Sheets

METHOD FOR SELECTING OPTIMAL I/O BUFFER

TECHNICAL FIELD

This invention relates to a method for selecting an optimal I/O buffer.

BACKGROUND

As is known in the art, selecting an input/output (I/O) buffer requires that the designer consider board topologies, board, response-time characteristics (i.e., speed, rise time, overshot, etc.), bus cross-talk, etc. Unfortunately, this cannot be done until the actual board has been manufactured. Selecting the optimal I/O buffer has many advantages such as optimized signal quality, lower switching noise and lower power consumption. More particularly, because designs are becoming faster, and power consumption is becoming a concern for the current and future platforms, each signal transmission has to be specifically designed and every watt saved. Integrated circuit (IC) I/O buffers determine the quality of the signal as well as consume roughly 30–40% of the total IC power. Hence, careful selection of the optimal I/O buffers might have a great impact on the final signal quality and total power consumption by potentially recommending an optimal drive buffer. Selecting high current drive buffers would result in better rise time at the expense of higher switching noise. Selecting the optimal buffer drive for a given board topology would eliminate any unnecessary switching noise on the board, resulting in better signal quality and reliability.

Any given Field Programmable Gate Array (FPGA) device, being programmable, enables the designer to "tweak" the I/O buffers to optimize its performance. However, in many cases, an Application Specific Integrated Circuit (ASIC) device follows the FPGA design, which does not enable the I/O buffers therein to be "tweaked", therefore requiring a pre-selected set of I/O buffers.

SUMMARY

In accordance with the present invention, a method is provided for selecting an I/O buffer. The method includes providing a plurality of I/O buffers. Each one of the plurality of I/O buffers has a different performance characteristic. Each one of the plurality of I/O buffers is coupled to a receiving device through a corresponding one of a plurality of transmission lines. Each one of the plurality of buffers is driven by a logic signal. Each one of the transmission lines produces a corresponding series of output logic signals. The plurality of output signals is observed. The method includes selecting one of the plurality of I/O buffers in accordance with the observed output signals.

In one embodiment, the selecting comprises selecting one of the plurality of I/O buffers in accordance with at least one predetermined criteria of the observed output signal produced by each of the plurality of buffers.

In one embodiment, the driving comprises driving each one of the plurality of buffers with a train of logic signals, each one of the transmission lines producing a corresponding series of output logic signals; the observing comprises observing the plurality of output signals; and the selecting comprises selecting one of the plurality of I/O buffers in accordance with a predetermined criteria of the observed output signals.

In accordance with another feature of the invention, a system is for selecting an I/O buffer. The system includes a plurality of I/O buffers, each one having a different performance characteristic. The system includes a plurality of transmission lines. A receiving device is coupled to the plurality of I/O buffers through a corresponding one of the plurality of transmission lines. A logic pulse generator is provided for driving each one of the plurality of buffers with a logic signal, each one of the transmission lines producing a corresponding output logic signal. A signal analyzer observes the output signal produced by the plurality of buffers.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
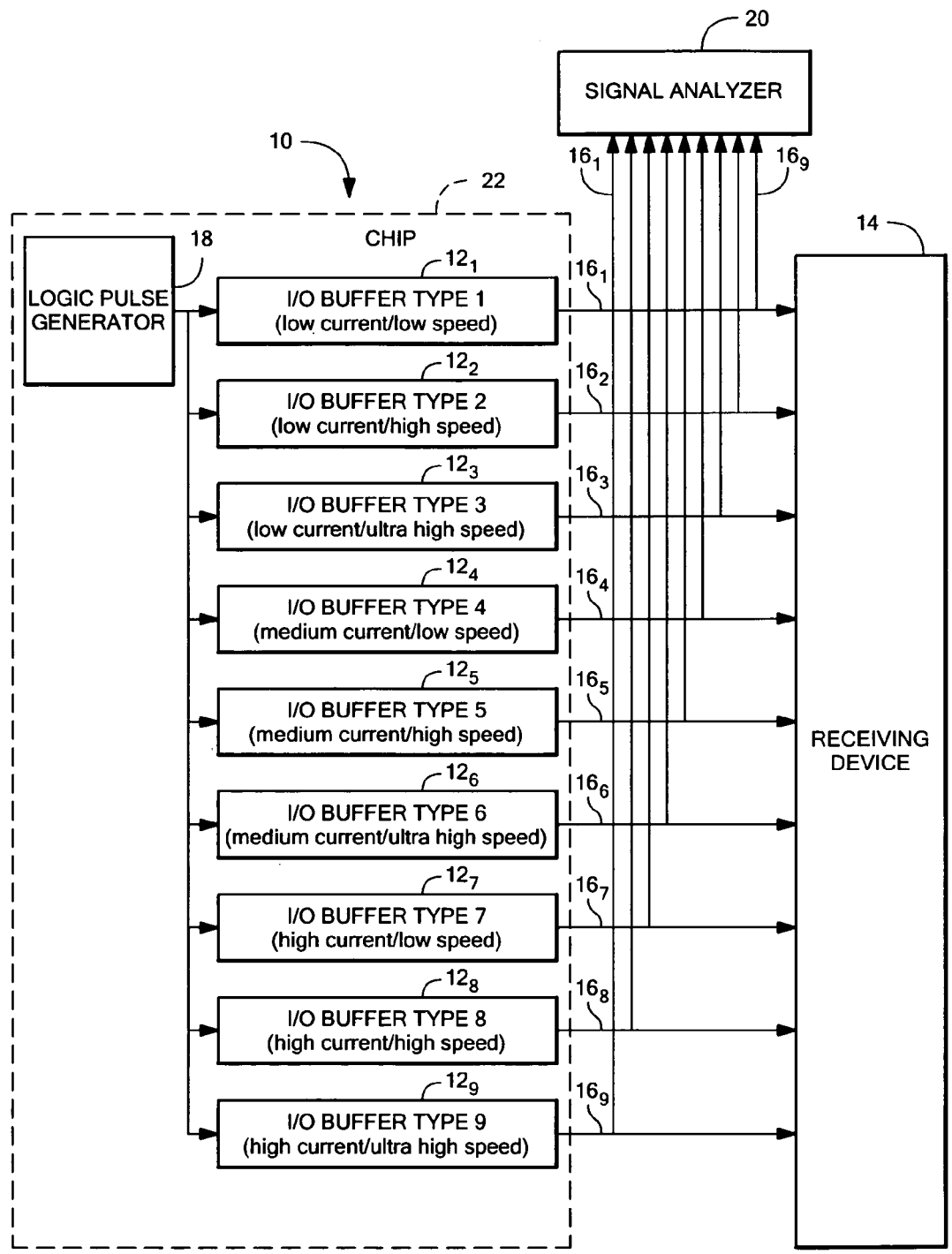
FIG. 1 is a block diagram of a system for selecting an I/O buffer in accordance with the invention.

Referring now to FIG. 1, a system 10 is shown for selecting an I/O buffer. The system 10 includes a plurality of, here nine, I/O buffers $12_1$–$12_9$. Each one of the plurality of I/O buffers has a different programmable performance characteristic. Thus, here I/O buffer $12_1$ is a referred to as a type 1 buffer and its performance characteristic is programmed such that it provides a low output current, here for example, 8 milliamps and has a relative slow response time. The I/O buffer $12_2$ is a referred to as a type 2 buffer and its performance characteristic is programmed such that it provides a low output current, here for example, 8 milliamps and has a relative fast response time. The I/O buffer $12_3$ is a referred to as a type 3 buffer and its performance characteristic is programmed such that it provides a low output current, here for example, 8 milliamps and has an ultra-fast response time. The I/O buffer $12_4$ is a referred to as a type 4 buffer and its performance characteristic is programmed such that it provides a medium output current, here for example, 12 milliamps and has a relative slow response time. The I/O buffer $12_5$ is a referred to as a type 5 buffer and its performance characteristic is programmed such that it provides a medium output current, here for example, 12 milliamps and has a relative fast response time. The I/O buffer $12_6$ is a referred to as a type 6 buffer and its performance characteristic is programmed such that it provides a medium output current, here for example, 12 milliamps and has an ultra-fast response time. The I/O buffer $12_7$ is a referred to as a type 7 buffer and its performance characteristic is programmed such that it provides a high output current, here for example, 16 milliamps and has a relative slow response time. The I/O buffer $12_8$ is a referred to as a type 8 buffer and its performance characteristic is programmed such that it provides a high output current, here for example, 16 milliamps and has a relative fast response time. The I/O buffer $12_9$ is a referred to as a type 9 buffer and its performance characteristic is programmed such that it provides a high output current, here for example, 16 milliamps and has an ultra-fast response time.

Figure 2:
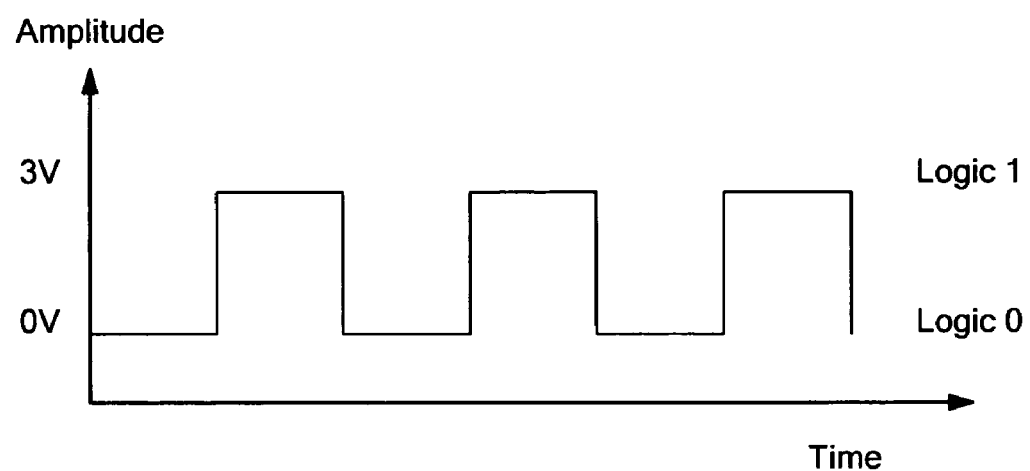
FIG. 2 is a timing diagram of logic signals used to drive I/O buffers used in the system of FIG. 1.

Each one of the plurality of I/O buffers $12_1$–$12_9$ is coupled to a receiving device 14 through a corresponding one of a plurality of transmission lines $16_1$–$16_9$, respectively as shown. It should be noted that the system 10 may have many more type 1–type 9 buffers coupled to the receiving device 14 through a corresponding transmission line. Each one of the plurality of buffers I/O buffers $12_1$–$12_9$ is driven by a logic signal produced by logic pulse generator 18. Here, the logic pulse generator 18 produces a train of logic pulses, here for example a logic 1 followed by a logic zero and so forth. Thus, here, for example, the voltage provided by the logic pulse generator would be a train of pulses stepping between a 0 volt level (i.e., here representing a logic 0) and a +3 volt level (here representing a logic 1, i.e., a train of 3 volt pulses, as shown in FIG. 2.

Figure 4:
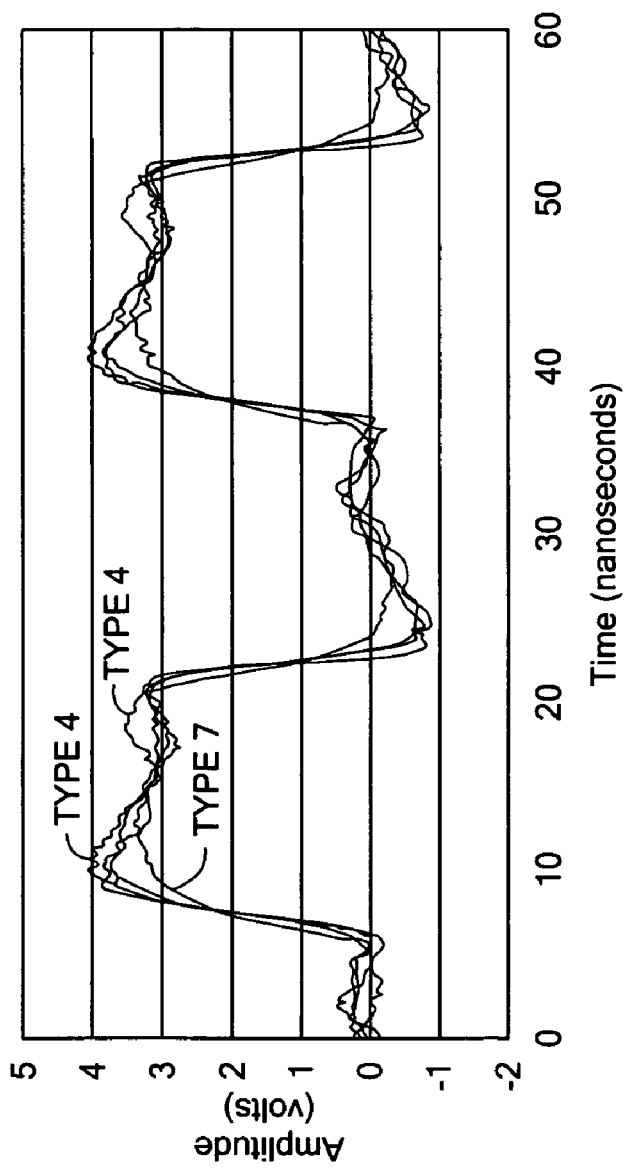
FIG. 4 is a timing diagram showing a plurality of criteria used in the observation of the responses of I/O devices of FIG. 1 from the logic signals in FIG. 2.

Each one of the transmission lines $16_1$–$16_9$, produces a corresponding series of output logic signals, as shown in FIG. 4, from a corresponding one of the I/O buffers $12_1$–$12_9$ in response to the a train of logic pulse provided by the logic pulse generator 18. The plurality of output signals on the transmission lines $16_1$–$16_9$ is observed by a signal analyzer 20. The method includes selecting one of the plurality of I/O buffers in accordance with predetermined criteria the observed output signals. It is noted that the plurality of I/O buffers $12_1$–$12_9$ are here disposed on a common IC chip 22.

Figure 3:
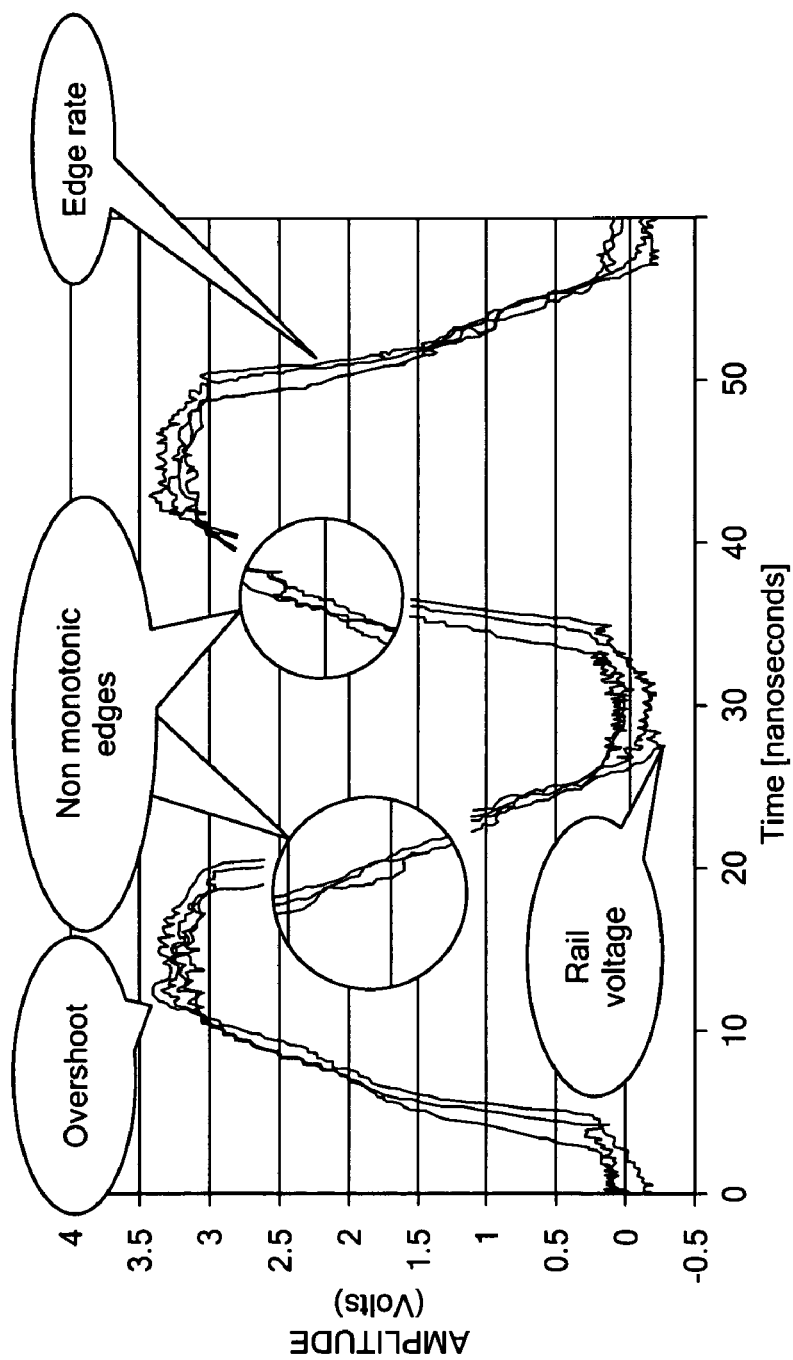
FIG. 3 is a timing diagram of the response of the I/O buffers of the system in FIG. 1 in response to the logic signals of FIG. 2.

More particularly, referring to FIG. 3, a series of output logic signals is shown. It is noted that each one of the transmission lines produces a corresponding series of output logic signals, depending on the physical characteristics of the medium it is connected to.

Some of the observed parameters are overshoot, non-monotonic edges, edge rate and closeness to rail voltage. Thus, in this example and referring again to FIG. 4, buffer type 4 has excessive overshoot while buffer type 7 has a slow edge rate. Thus, buffer types 4 and 7 would not be selected while any of the other 7 buffer types, here buffer types 1–3, 5–6, 8–9 could be selected. Here, type 6 is selected (i.e., medium output current, here for example, 12 milliamps and has an ultra-fast response time.

Once selected, all I/O buffers $12_1$–$12_9$ are programmed with the characterictics of type 6, here, medium output current, here for example, 12 milliamps and has an ultra-fast response time. The chip 22 (FIG. 1) is then test again with I/O buffers $12_1$–$12_9$ with the characteristics of the selected type, here for example, type 6. The plurality of output signals on the transmission lines $16_1$–$16_9$ is observed again by the signal analyzer 20. If the plurality of output signals on the transmission lines $16_1$–$16_9$ meet the criteria, the process is complete and type 6, in this example, will be applied to the final design planned for the FPGA that will, in turn, be applied to an ASIC. At the end of the process, one of the types is selected and provided to the ASIC manufacturer for the final ASIC chip. On the other hand, if the plurality of output signals on the transmission lines $16_1$–$16_9$ do not meet the criteria, and other one of buffer types 1–3, 5, 8–9 is selected and the chip 22 (FIG. 1) is then test again with I/O buffers $12_1$–$12_9$ with the characteristics of the newly selected type.

Figure 5:
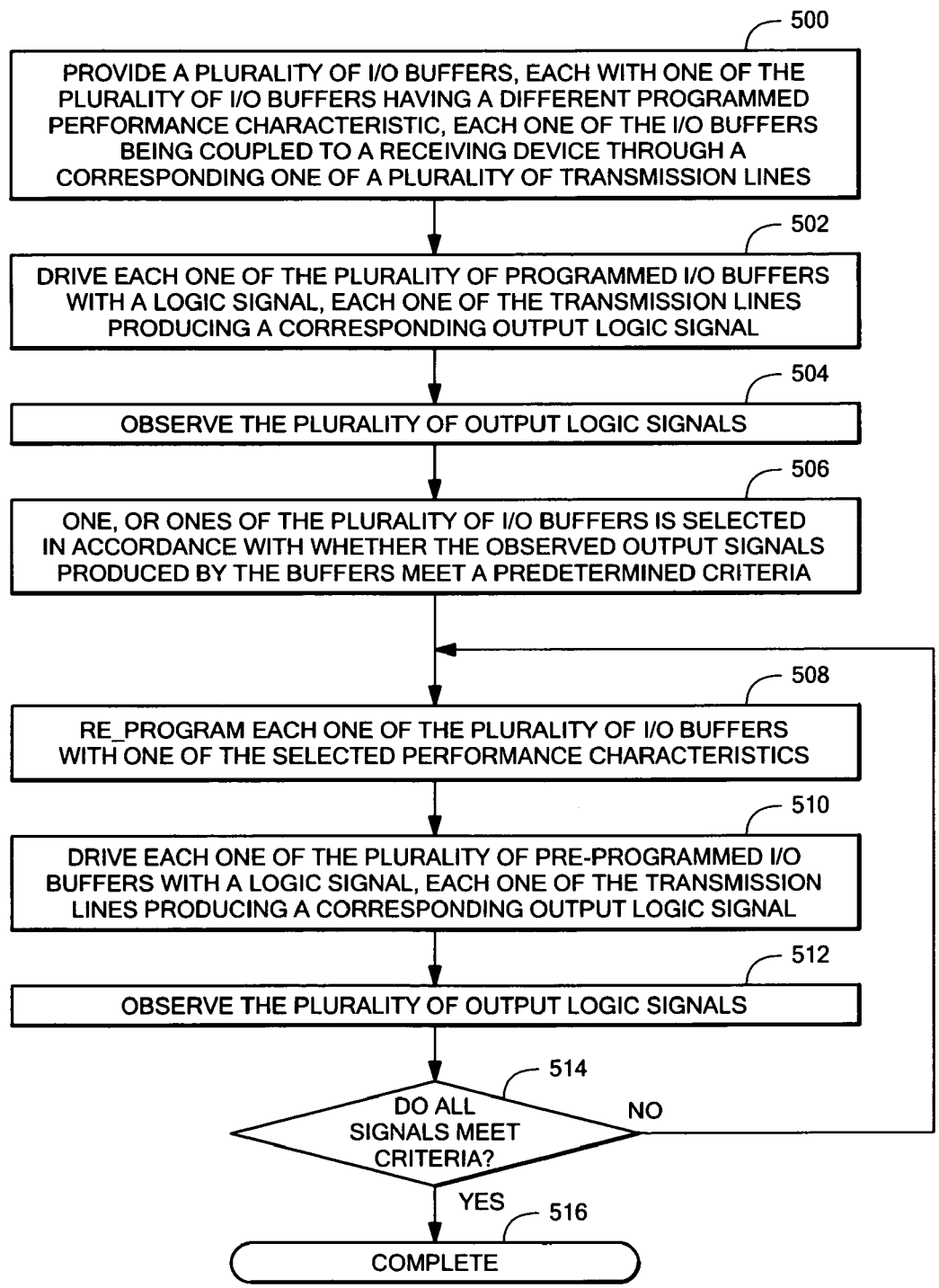
FIG. 5 is a flow diagram of the process used to select one or ones of the I/O buffers used in the system of FIG. 1 in accordance with the invention.

A flow diagram of the process is shown in FIG. 5. Thus, in Step 500, a plurality of I/O buffers is provided, each one of the plurality of I/O buffers having a different programmed performance characteristic, each one of the programmed plurality of I/O buffers being coupled to a receiving device through a corresponding one of a plurality of transmission lines.

In Step 502, each one of the plurality of programmed buffers is driven by a logic signal. Each one of the transmission lines produces a corresponding of output logic signal. In the example above, each one of the plurality of programmed buffers with is driven with a train of logic signals.

In Step 504, the plurality of output signals is observed.

In Step 506, one, or ones, of the plurality of I/O buffers is selected in accordance with whether the observed output signal produced by each of the plurality of buffers meet a predetermined criterion.

In Step 508, all I/O buffers $12_1$–$12_9$ are programmed with the performance characteristics of one the I/O buffers $12_1$–$12_9$ which meets the predetermined criteria.

In Step 510, each one of the plurality of buffers $12_1$–$12_9$, now all programmed with the same performance characteristics, is driven by a logic signal. Each one of the transmission lines produces a corresponding output logic signal.

In Step 512 the plurality of output signals is observed.

In Step 514, if the plurality of output signals on the transmission lines $16_1$–$16_9$ meet the criteria, the process is complete and the selected type will be applied to the final design planned for the FPGA that will, in turn, be applied to an ASIC and provided to the ASIC manufacturer for the final ASIC chip, Step 516. On the other hand, if in Step 514, the plurality of output signals on the transmission lines $16_1$–$16_9$ do not meet the criteria, another one of buffer types meeting the selection process of Step 506 is selected and the chip 22 (FIG. 1) is then test again with I/O buffers $12_1$–$12_9$ with the characteristics of the newly selected type. Steps 506 and 512 may be repeated as necessary to verify the proper operation and validity of selection made in previous iterations of these steps. A number of embodiments of the invention have been described. Nevertheless, it will be understood that various modifications may be made without departing from the spirit and scope of the invention. Accordingly, other embodiments are within the scope of the following claims.

What is claimed is:

1. A method for selecting a I/O buffer, comprising:
   providing a plurality of I/O buffers, each one having a different performance characteristic, each one of the plurality of I/O buffers being coupled to a receiving device through a corresponding one of a plurality of transmission lines;
   driving each one of the plurality of buffers with a logic signal, each one of the transmission lines producing a corresponding output logic signal;
   observing the output signal produced by the plurality of buffers;
   selecting one of the plurality of I/O buffers in accordance with the observed output signal produced by each of the plurality of buffers; and
   wherein the selecting comprises selecting one of the plurality of I/O buffers in accordance with a predetermined criteria of the observed output signal produced by each of the plurality of buffers.

2. The method recited in claim 1 wherein the driving comprises driving each one of the plurality of buffers with a train of logic signals, each one of the transmission lines producing a corresponding series of output logic signals; the observing comprises observing the plurality of output signals; and the selecting comprises selecting one of the plurality of I/O buffers in accordance with a predetermined criteria of the observed output signals.

3. A method for selecting a I/O buffer, comprising:
  (a) providing a plurality of I/O buffers, each one of the plurality of I/O buffers having a different programmed performance characteristic, each one of the programmed plurality of I/O buffers being coupled to a receiving device through a corresponding one of a plurality of transmission lines;
  (b) driving each one of the plurality of programmed buffers with a logic signal, each one of the transmission lines producing a corresponding output logic signals;
  (c) observing the plurality of output signal;
  (d) selecting one, or ones, of the plurality of I/O buffers in accordance with whether the observed output signal produced by each of the plurality of buffers meets a predetermined criterion;
  (e) programming the plurality of I/O buffers with the performance characteristics of one the selected plurality of I/O buffers;
  (f) driving each one of the programmed plurality of buffers having with the performance characteristics of one of the selected plurality of I/O buffers each one of the transmission lines producing a corresponding output logic signal;
  (g) observing the plurality of output signals in (f);
  (h) if the plurality of observed output signals in (f) meet the predetermined criteria, the process is complete and the selected type will be applied to the final design; otherwise, if the plurality of observed output signals in (f) fail to meet the predetermined criteria criteria, another one of buffer types meeting the selection process in (d) is selected and the method returns to (e).

* * * * *